(12) United States Patent
Kuo

(10) Patent No.: US 7,950,839 B2
(45) Date of Patent: May 31, 2011

(54) LIGHT EMITTING DIODE HAVING ELECTRODES WITH BRANCHES AND BACKLIGHT MODULE USING SAME

(75) Inventor: Chao-Tsun Kuo, Miao-Li (TW)

(73) Assignee: Chimei Innolux Corporation, Miao-Li County (TW)

( * ) Notice: Subject to any disclaimer, the term of this patent is extended or adjusted under 35 U.S.C. 154(b) by 508 days.

(21) Appl. No.: 12/080,364

(22) Filed: Apr. 2, 2008

(65) Prior Publication Data

US 2008/0239752 A1    Oct. 2, 2008

(30) Foreign Application Priority Data

Apr. 2, 2007   (TW) .............................. 96111564 A

(51) Int. Cl.
*F21V 7/04*     (2006.01)
*G09F 13/08*    (2006.01)
*H01L 33/00*    (2010.01)

(52) U.S. Cl. .......... 362/631; 362/630; 362/97.3; 257/99

(58) Field of Classification Search .................. 362/612, 362/631, 800, 630, 97.1–97.3, 249.02, 249.04; 257/99, E33.066, 98, 100, 103
See application file for complete search history.

(56) References Cited

U.S. PATENT DOCUMENTS

| | | | |
|---|---|---|---|
| 6,299,056 | B1 | 10/2001 | Oota |
| 6,486,543 | B1* | 11/2002 | Sano et al. ..................... 257/684 |
| 7,101,073 | B2* | 9/2006 | Li ................................. 362/621 |
| 2002/0008805 | A1 | 1/2002 | Kawakami et al. |
| 2007/0029572 | A1* | 2/2007 | Han et al. ........................ 257/99 |

FOREIGN PATENT DOCUMENTS

| | | |
|---|---|---|
| CN | 2350888 Y | 11/1999 |
| JP | 58216449 A | 12/1983 |
| JP | 2002223004 A | 8/2002 |

* cited by examiner

*Primary Examiner* — Bao Q Truong
(74) *Attorney, Agent, or Firm* — Wei Te Chung

(57) ABSTRACT

An exemplary light emitting diode (23) includes a package body (231) and two electrodes (233) attached to the package body. Each of the electrodes includes a main body and a plurality of branches extending from the main body. The branches of each electrode together with a corresponding portion of the main body cooperatively define an accommodation space therebetween.

20 Claims, 5 Drawing Sheets

LIGHT EMITTING DIODE HAVING ELECTRODES WITH BRANCHES AND BACKLIGHT MODULE USING SAME

FIELD OF THE INVENTION

The present invention relates to a light emitting diode having electrodes with branches, and to a backlight module using such light emitting diode.

GENERAL BACKGROUND

Liquid crystal displays have the advantages of portability, low power consumption, and low radiation. Therefore, liquid crystal displays have been widely used in common daily life. Typically, a liquid crystal display includes a backlight module having a cold cathode fluorescent lamp as a light source. However, the cold cathode fluorescent lamp has high power consumption compared with other light sources such as light emitting diodes (LEDs). Therefore manufacturers are where practicable seeking to replace cold cathode fluorescent lamps with light emitting diodes as the light source of liquid crystal displays.

FIG. 7 is an exploded, isometric view of certain components of a conventional backlight module. The backlight module 10 typically includes a flexible printed circuit board 11, a plurality of light emitting diodes 13 arranged on a top surface (not labeled) of the flexible printed circuit board 11, and a light guide plate 15. The light guide plate 15 includes a light incident surface 151, and a light emission surface 152 perpendicularly connected with the light incident surface 151. The light emitting diodes 13 are located adjacent to the light incident surface 151 of the light guide plate 15. The flexible printed circuit board 11 includes a plurality of solder pads (not shown). The light emitting diodes 13 are soldered on the solder pads and thereby electrically connected to the flexible printed circuit board 11.

Referring also to FIG. 8, this is an enlarged, inverted view of one of the light emitting diodes 13. The light emitting diode 13 includes a light emission portion 137 and two electrodes 133. The light emission portion 137 is located at one side of the light emitting diode 13 that is adjacent to the light incident surface 151 of the light guide plate 15. The electrodes 133 are located at two opposite lateral sides of the light emission portion 137. Light beams emitted from the light emission portion 137 of the light emitting diode 13 enter the light guide plate 15 via the light incident surface 151.

Referring also to FIG. 9, this is an enlarged, front plan view of one of the light emitting diodes 13 on the flexible printed circuit board 11. When the light emitting diode 13 is soldered to the flexible printed circuit board 11, solder material is melted and covers solder pad areas A of the flexible printed circuit board 11. In particular, some of the solder material interposes between solder pads (not labeled) of the flexible printed circuit board 11 and the electrodes 133. That is, a gap D between each of the solder pads and the corresponding electrode 133 is generated. As a result, part of the light emission portion 137 of the light emitting diode 13 may be located above the light emission surface 152 of the light guide plate 15. Therefore some light beams emitted from the light emitting diode 13 may not enter the light incident surface 151 of the light guide plate 15. This reduces the emitting luminance of the backlight module 10.

FIG. 10 is a chart showing a relationship between a relative emitting luminance of the backlight module 10 and a relative distance of each of the electrodes 133 of the light emitting diode 13 from the flexible printed circuit board 11. Horizontal coordinate values of the graph represent the relative distance of each electrode 133 of the light emitting diode 13 from the flexible printed circuit board 11. If the electrodes 133 of the light emitting diode 13 contact the flexible printed circuit board 11 directly, the relative distance is defined as 0. If the electrodes 133 of the light emitting diode 13 are substantially above the light incident surface 151 of the light guide plate 15, the relative distance is defined as 1. Vertical coordinate values of the graph represent the relative emitting luminance of the backlight module 10. If the backlight module 10 has a smallest possible luminance, the relative emitting luminance is defined as 0. If the backlight module 10 has a largest possible luminance, the relative emitting luminance is defined as 1. It can be seen that the greater the value of the relative distance, the lower the value of the relative emitting luminance. That is, the greater the distance of the electrodes 133 of the light emitting diode 13 from the flexible printed circuit board 11, the lower the emitting luminance of the backlight module 10.

Furthermore, when part of the light emission portion 137 of the light emitting diode 13 is above the light emission surface 152 of the light guide plate 15, this is liable to increase the thickness (height) of the backlight module 10.

What is needed, therefore, is a light emitting diode and a backlight module employing the light emitting diode which can overcome the above-described deficiencies.

SUMMARY

A light emitting diode includes a package body and two electrodes attached to the package body. Each of the electrodes includes a main body and a plurality of branches extending from the main body. The branches of each electrode together with a corresponding portion of the main body cooperatively define at least one accommodation space therebetween.

A backlight module includes a light guide plate, a flexible printed circuit board, and a plurality of light emitting diodes on the flexible printed circuit board. The light guide plate includes a light incident surface. The flexible printed circuit board is disposed near the light incident surface of the light guide plate. Each of the light emitting diodes includes two electrodes. Each electrode defines at least one accommodation space for receiving solder material.

Other novel features and advantages will become more apparent from the following detailed description when taken in conjunction with the accompanying drawings.

DETAILED DESCRIPTION OF PREFERRED EMBODIMENTS

Reference will now be made to the drawings to describe preferred and exemplary embodiments in detail.

Figure 1:
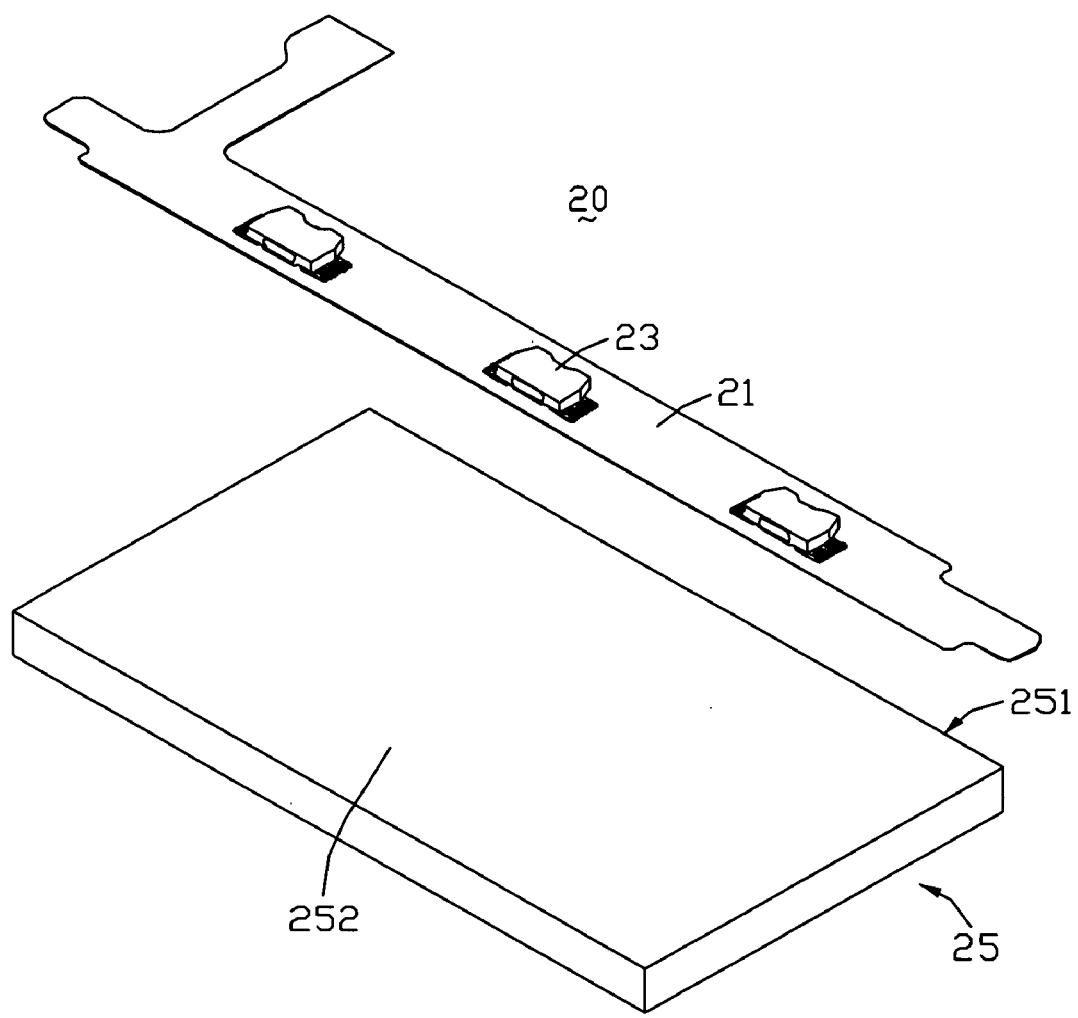
FIG. 1 is an exploded, isometric view of certain components of a backlight module according to a first embodiment of the present invention, the backlight module including a plurality of light emitting diodes and a flexible printed circuit board.

FIG. 1 is an exploded, isometric view of certain components of a backlight module 20 according to a first embodiment of the present invention. The backlight module 20 typically includes a flexible printed circuit board 21, a plurality of light emitting diodes 23 arranged on a top surface (not labeled) of the flexible printed circuit board 21, and a light guide plate 25. The light guide plate 25 includes a light incident surface 251, and a light emission surface 252 perpendicularly connected with the light incident surface 251. The light emitting diodes 23 are located adjacent to the light incident surface 251 of the light guide plate 15. The flexible printed circuit board 21 includes a plurality of solder pads (not labeled) for electrically connecting the light emitting diodes 23 thereon.

Figure 2:
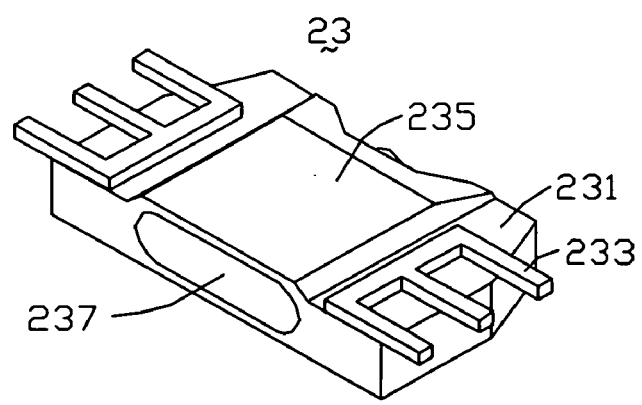
FIG. 2 is an enlarged, inverted view of one of the light emitting diodes of FIG. 1.

Referring also to FIG. 2, this is an enlarged, inverted view of one of the light emitting diodes 23. The light emitting diode 23 includes a package body 231 and two E-shaped electrodes 233. The electrodes 233 are electrically connected with internal components of the package body 231, respectively. The package body 231 includes a bottom protrusion 235 and a light emission portion 237. The protrusion 235 is formed at a middle portion of a bottom side of the light emitting diode 23, and has a low profile. In particular, the protrusion 235 has a generally isosceles trapezoidal profile. The light emission portion 237 is exposed at a front side of the light emitting diode 23, and is located adjacent to the light incident surface 251 of the light guide plate 25. Light beams emitted from the light emission portion 237 of the light emitting diode 23 enter the light guide plate 25 via the light incident surface 251.

The two E-shaped electrodes 233 are symmetrically arranged at two opposite lateral sides of the protrusion 235 respectively. Each E-shaped electrode 233 has a thickness substantially the same as a thickness (height) of the protrusion 235. Each E-shaped electrode 233 includes a main body (not labeled), and three branches (not labeled) extending perpendicularly from the main body. The three branches are parallel with each other, and extend in a direction parallel with the flexible printed circuit board 21. Every two adjacent branches of each electrode 233 and a corresponding portion of the main body cooperatively define a semi-enclosed space (not labeled) therebetween for receiving solder material.

Figure 3:
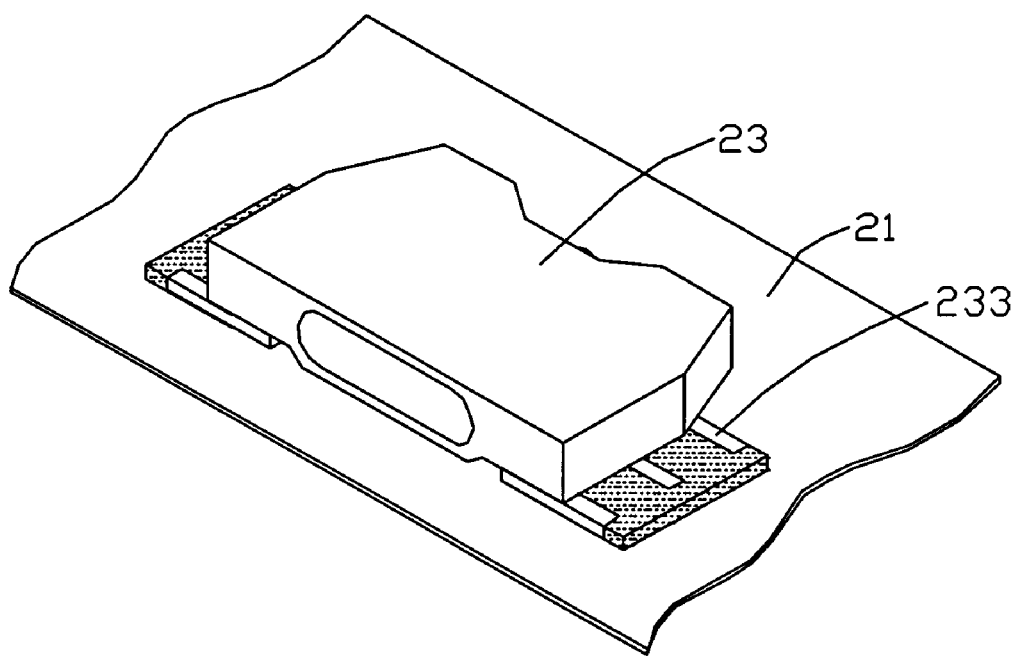
FIG. 3 is an enlarged view of one of the light emitting diodes on the flexible printed circuit board of FIG. 1.
Figure 4:
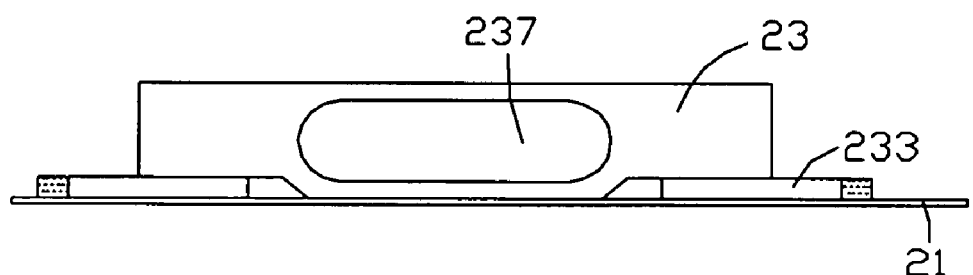
FIG. 4 is an enlarged, front plan view of the light emitting diode and the flexible printed circuit board of FIG. 3.

Referring also to FIG. 3, this is an enlarged view of the light emitting diode 23 on the flexible printed circuit board 21. When the light emitting diode 23 is soldered to the flexible printed circuit board 21, solder material is melted and some solder material is received in the semi-enclosed space of the electrodes 233 of the light emitting diode 23. That is, the solder material need not interpose between the flexible printed circuit board 21 and bottom surfaces of the electrodes 233 of the light emitting diode 23. Therefore, as shown in FIG. 4, a vertical gap between the flexible printed circuit board 21 and the electrodes 233 need not be generated. As a result, a topmost extremity of the light emission portion 237 of the light emitting diode 23 can be located below the light emission surface 252 of the light guide plate 25. Substantially all light beams emitted from the light emission portion 237 of the light emitting diode 23 can enter the light incident surface 251 of the light guide plate 25. This increases the emitting luminance of the backlight module 20.

Furthermore, because the light emission portion 237 of the light emitting diode 23 does not protrude above the light emission surface 252 of the light guide plate 25, the thickness of the backlight module 20 can be minimized.

Figure 5:
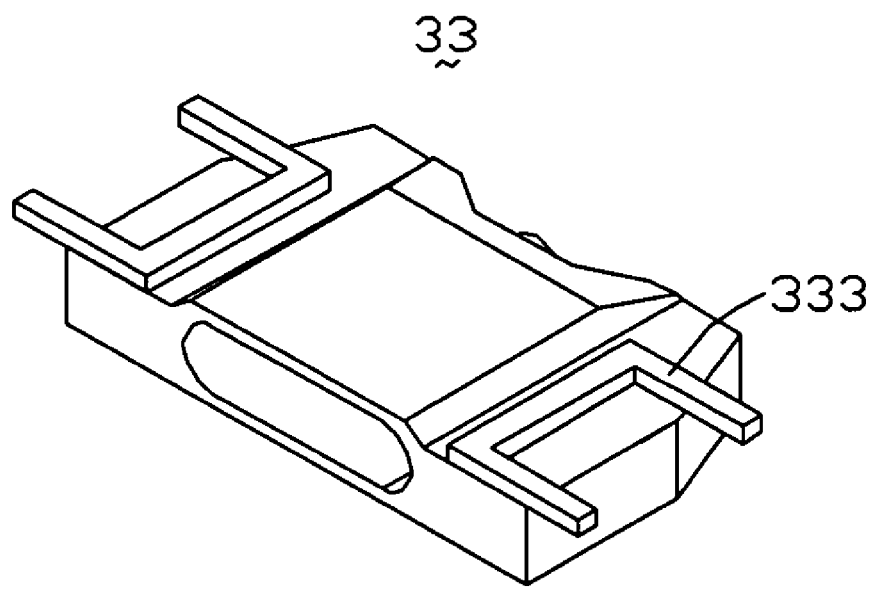
FIG. 5 is an isometric, inverted view of a light emitting diode of a backlight module according to a second embodiment of the present invention.

FIG. 5 is an isometric, inverted view of a light emitting diode 33 of a backlight module according to a second embodiment of the present invention. The light emitting diode 33 has a structure similar to that of the light emitting diode 23. However, each electrode 333 of the light emitting diode 33 is generally C-shaped (or generally U-shaped). The electrode 333 includes a main body (not labeled), and two branches (not labeled) perpendicularly extending from the main body. The two branches extend from two opposite ends (not labeled) of the main body respectively. The two branches together with the main body cooperatively define a semi-enclosed space (not labeled) therebetween for receiving solder material.

Figure 6:
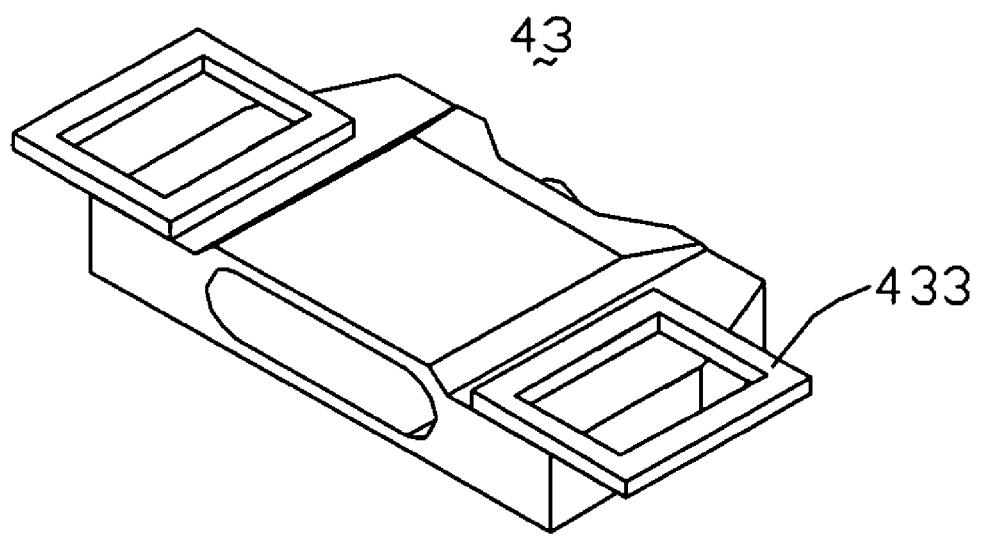
FIG. 6 is an isometric, inverted view of a light emitting diode of a backlight module according to a third embodiment of the present invention.
Figure 7:
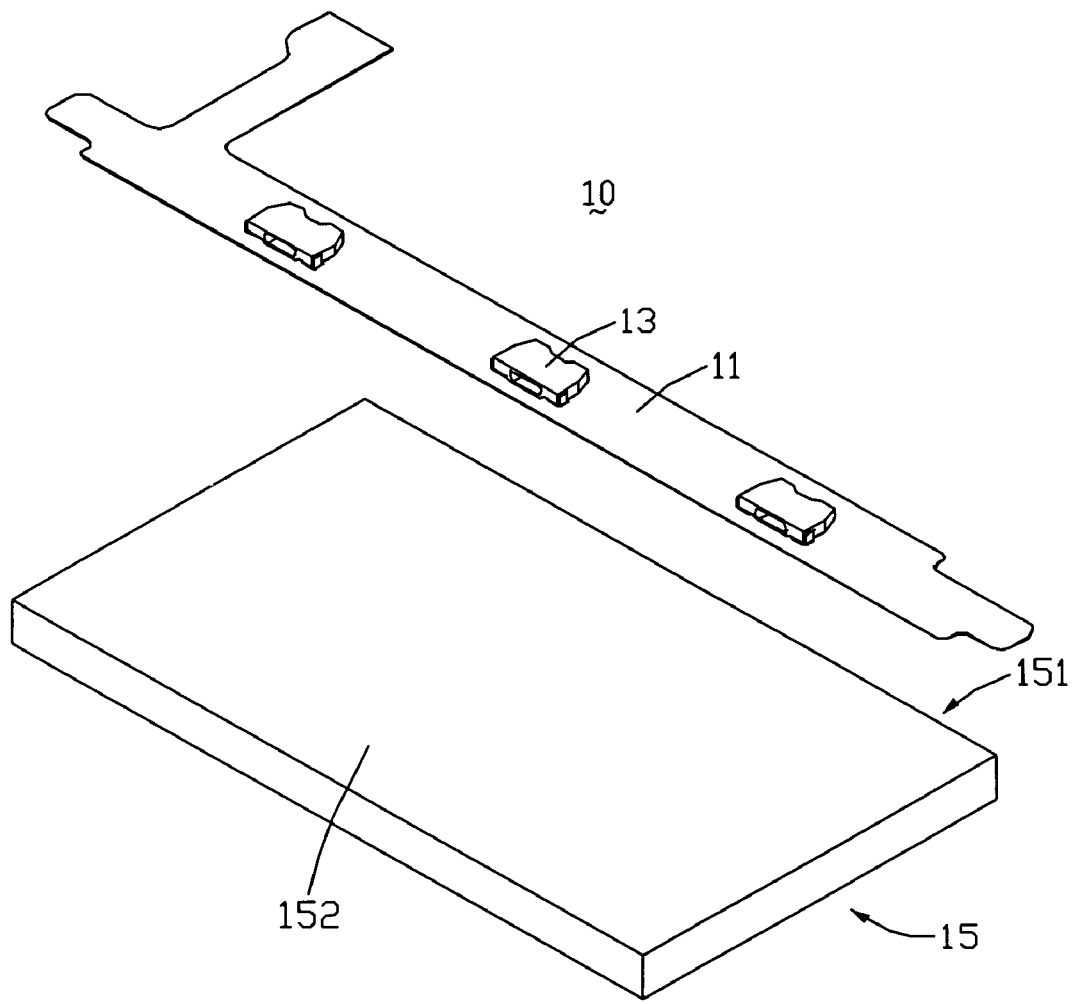
FIG. 7 is an exploded, isometric view of certain components of a conventional backlight module, the backlight module including a plurality of light emitting diodes and a flexible printed circuit board.
Figure 8:
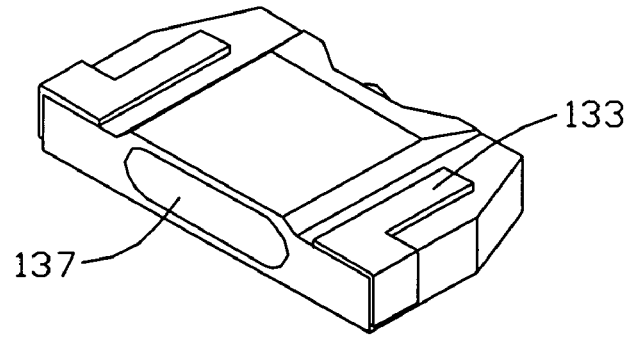
FIG. 8 is an enlarged, inverted view of one of the light emitting diodes of FIG. 7.
Figure 9:
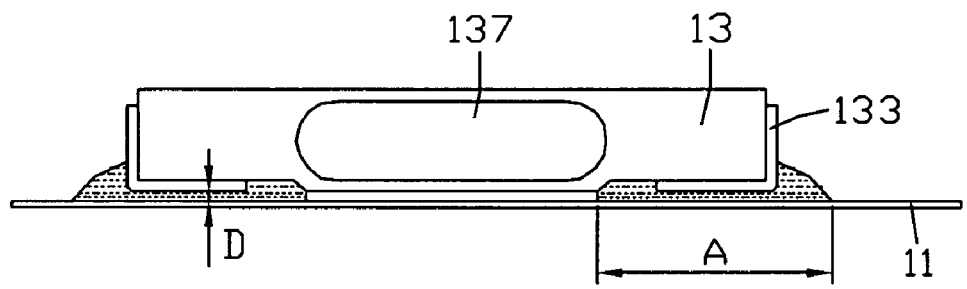
FIG. 9 is an enlarged, front plan view of one of the light emitting diodes on the flexible printed circuit board of FIG. 7.
Figure 10:
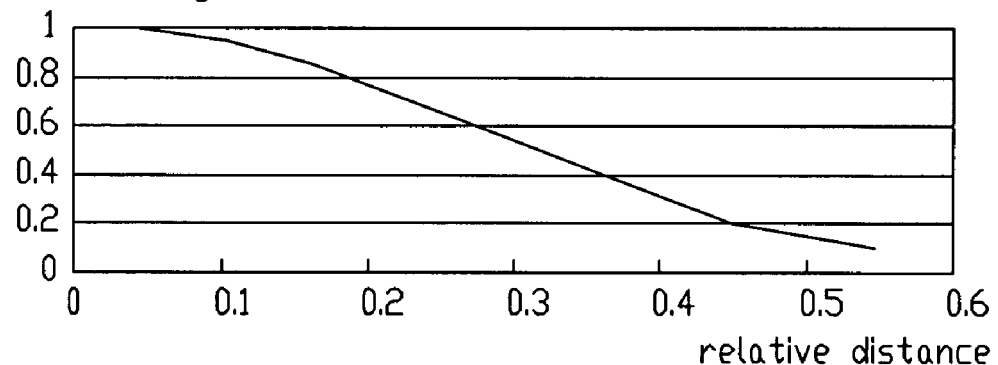
FIG. 10 is a chart showing a relationship between a relative emitting luminance of the backlight module of FIG. 7 and a relative distance of each of electrodes of each light emitting diode from the flexible printed circuit board.

FIG. 6 is an isometric, inverted view of a light emitting diode 43 of a backlight module according to a third embodiment of the present invention. The light emitting diode 43 has a structure similar to that of the light emitting diode 23. However, each electrode 433 of the light emitting diode 43 is in the form of a rectangular frame (or is generally O-shaped). Thereby, the electrode 433 defines an enclosed space for receiving solder material. In the illustrated embodiment, the accommodation space is rectangular.

It is to be further understood that even though numerous characteristics and advantages of the present embodiments have been set out in the foregoing description, together with details of the structures and functions of the embodiments, the disclosure is illustrative only; and that changes may be made in detail, especially in matters of shape, size, and arrangement of parts within the principles of the invention to the full extent indicated by the broad general meaning of the terms in which the appended claims are expressed.

What is claimed is:

1. A light emitting diode mounted on a flexible printed circuit board, comprising:
   a package body; and
   two electrodes attached to the package body, each of the electrodes comprising:
   a main body; and
   a plurality of branches extending from the main body;
   wherein the branches of each electrode together with a corresponding portion of the main body cooperatively define at least one accommodation space therebetween, solder material is received in the at least one accommodation space and whereby the electrodes of the light emitting diode directly contact the flexible printed circuit board.

2. The light emitting diode as claimed in claim 1, wherein the at least one accommodation space is a semi-enclosed space.

3. The light emitting diode as claimed in claim 1, wherein each electrode comprises three branches parallel with each other.

4. The light emitting diode as claimed in claim 1, wherein each electrode is an E-shaped electrode.

5. The light emitting diode as claimed in claim 4, wherein each electrode defines two accommodation spaces.

6. The light emitting diode as claimed in claim 1, wherein each electrode comprises two branches.

7. The light emitting diode as claimed in claim 6, wherein the two branches extend from two opposite ends of the main body and together with the main body cooperatively define the at least one accommodation space in the form of a semi-enclosed space.

8. The light emitting diode as claimed in claim 1, wherein the main body and the branches of each electrode cooperatively form a frame shape, which defines the at least one accommodation space in the form of an enclosed space.

9. The light emitting diode as claimed in claim 1, wherein the package body comprises a protrusion, and the two electrodes are at two opposite sides of the protrusion, respectively.

10. The light emitting diode as claimed in claim 9, wherein the protrusion has a generally isosceles trapezoidal profile.

11. The light emitting diode as claimed in claim 9, wherein the protrusion is formed at a middle portion of one major side of the light emitting diode, and a bottom surface of the protrusion and a bottom surface of each electrode are all coplanar with one another.

12. The light emitting diode as claimed in claim 11, wherein the package body further comprises a light emission portion located at another side of the light emitting diode.

13. A backlight module, comprising:
a light guide plate, comprising a light incident surface;
a flexible printed circuit board disposed near the light incident surface of the light guide plate; and
a plurality of light emitting diodes on the flexible printed circuit board, each of the light emitting diodes comprising two electrodes, each electrode defining at least one opening;
wherein solder material is accommodated in the at least one opening in such a manner that no solder material is interposed between the flexible printed circuit board and the electrodes of the light emitting diodes.

14. The backlight module as claimed in claim 13, wherein each of the light emitting diodes further comprises a package body, and the two electrodes are attached to the package body.

15. The backlight module as claimed in claim 14, wherein the package body comprises a protrusion and a light emission portion, the protrusion is located at a side of the light emitting diode that is adjacent to the flexible printed circuit board, and the light emission portion is located at another side of the light emitting diode that is adjacent to the light incident surface of the light guide plate.

16. The backlight module as claimed in claim 15, wherein the light guide plate further comprises a light emission surface, and a topmost extremity of the light emission portion of each of the light emitting diodes is below the light emission surface of the light guide plate.

17. The backlight module as claimed in claim 13, wherein each electrode comprises a main body and a plurality of branches extending from the main body.

18. The backlight module as claimed in claim 13, wherein each electrode is E-shaped.

19. The backlight module as claimed in claim 13, wherein the at least one opening is a semi-enclosed space.

20. A light source assembly, comprising a flexible printed circuit board and at least one light emitting diode mounted on the flexible printed circuit board;
the at least one light emitting diode comprising a package body and two electrodes attached to the package body, each of the electrodes provide at least one accommodation space for receiving solder material,
wherein the electrodes of the light emitting diode abut the flexible printed circuit board without any gap containing solder material between the electrodes of the light emitting diode and the flexible printed circuit board.

* * * * *